United States Patent
Okada et al.

(10) Patent No.: US 6,514,860 B1
(45) Date of Patent: Feb. 4, 2003

(54) INTEGRATION OF ORGANIC FILL FOR DUAL DAMASCENE PROCESS

(75) Inventors: Lynne A. Okada, Sunnyvale, CA (US); Fei Wang, San Jose, CA (US); James K. Kai, San Francisco, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/892,750

(22) Filed: Jun. 28, 2001

Related U.S. Application Data
(60) Provisional application No. 60/265,076, filed on Jan. 31, 2001.

(51) Int. Cl.$^7$ ................................................ H01L 21/44
(52) U.S. Cl. ............... 438/687; 438/621; 438/637; 438/638; 438/622; 438/623; 438/634; 438/700; 438/706; 438/738
(58) Field of Search ........................... 438/687, 621, 438/638, 622, 623, 634, 700, 706, 738, 637

(56) References Cited

U.S. PATENT DOCUMENTS

| | | | |
|---|---|---|---|
| 6,040,243 A | * 3/2000 | Li et al. | 438/624 |
| 6,057,239 A | 5/2000 | Wang et al. | |
| 6,147,404 A | * 11/2000 | Pramanick et al. | 257/750 |
| 6,171,949 B1 | * 1/2001 | You et al. | 438/633 |
| 6,197,681 B1 | * 3/2001 | Liu et al. | 438/624 |
| 6,251,772 B1 | * 6/2001 | Brown | 438/625 |
| 6,323,123 B1 | * 11/2001 | Liu et al. | 438/638 |
| 6,391,472 B1 | * 5/2002 | Lamb et al. | 428/624 |

FOREIGN PATENT DOCUMENTS

| | | |
|---|---|---|
| EP | 0 895 238 A3 | 5/2000 |
| WO | 00/14793 | 3/2000 |

* cited by examiner

*Primary Examiner*—Matthew Smith
*Assistant Examiner*—V. Yevsikov

(57) ABSTRACT

A method of manufacturing a semiconductor device includes forming a second barrier layer over a first level, forming a first dielectric layer over the second barrier layer, forming a second dielectric layer over the first dielectric layer, etching the first and second dielectric layers to form an opening through the first dielectric layer and the second dielectric layer, depositing an organic fill material in the opening and removing a portion of the organic fill material before etching the second dielectric layer to form a trench. The organic fill material can then be completely removed and the second barrier layer is etched to expose the first level. The trench and a via are then filled with a conductive material to form a feature.

20 Claims, 14 Drawing Sheets

INTEGRATION OF ORGANIC FILL FOR DUAL DAMASCENE PROCESS

RELATED APPLICATIONS

This application claims priority from U.S. Provisional Patent Application Ser. No. 60/265,076, filed Jan. 31, 2001.

FIELD OF THE INVENTION

The present invention relates to the manufacturing of semiconductor devices, and more particularly, to copper and copper alloy metallization in semiconductor devices.

BACKGROUND OF THE INVENTION

The escalating requirements for high density and performance associated with ultra large scale integration (ULSI) semiconductor device wiring are difficult to satisfy in terms of providing sub-micron-sized, low resistance-capacitance (RC) metallization patterns. This is particularly applicable when the sub-micron-features, such as vias, contact areas, lines, trenches, and other shaped openings or recesses have high aspect ratios (depth-to-width) due to miniaturization.

Conventional semiconductor devices typically comprise a semiconductor substrate, usually of doped monocrystalline silicon (Si), and a plurality of sequentially formed inter-metal dielectric layers and electrically conductive patterns. An integrated circuit is formed therefrom containing a plurality of patterns of conductive lines separated by inter-wiring spacings, and a plurality of interconnect lines, such as bus lines, bit lines, word lines and logic interconnect lines. Typically, the conductive patterns of vertically spaced metallization levels are electrically interconnected by vertically oriented conductive plugs filling via holes formed in the inter-metal dielectric layer separating the metallization levels, while other conductive plugs filling contact holes establish electrical contact with active device regions, such as a source/drain region of a transistor, formed in or on a semiconductor substrate. Conductive lines formed in trench-like openings typically extend substantially parallel to the semiconductor substrate. Semiconductor devices of such type according to current technology may comprise five or more levels of metallization to satisfy device geometry and microminiaturization requirements.

A commonly employed method for forming conductive plugs for electrically interconnecting vertically spaced metallization levels is known as "damascene" -type processing. Generally, this process involves forming a via opening in the inter-metal dielectric layer or interlayer dielectric (ILD) between vertically spaced metallization levels which is subsequently filled with metal to form a via electrically connecting the vertically spaced apart metal features. The via opening is typically formed using conventional lithographic and etching techniques. After the via opening is formed, the via is filled with a conductive material, such as tungsten (W), using conventional techniques, and the excess conductive material on the surface of the inter-metal dielectric layer is then typically removed by chemical mechanical planarization (CMP).

A variant of the above-described process, termed "dual damascene" processing, involves the formation of an opening having a lower contact or via opening section which communicates with an upper trench section. The opening is then filled with a conductive material to simultaneously form a contact or via in contact with a conductive line. Excess conductive material on the surface of the inter-metal dielectric layer is then removed by CMP. An advantage of the dual damascene process is that the contact or via and the upper line are formed simultaneously.

High performance microprocessor applications require rapid speed of semiconductor circuitry, and the integrated circuit speed varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. If the interconnection node is routed over a considerable distance, e.g., hundreds of microns or more, as in submicron technologies, the interconnection capacitance limits the circuit node capacitance loading and, hence, the circuit speed. As integration density increases and feature size decreases, in accordance with submicron design rules, the rejection rate due to integrated circuit speed delays significantly reduces manufacturing throughput and increases manufacturing costs.

One way to increase the circuit speed is to reduce the resistance of a conductive pattern. Conventional metallization patterns are typically formed by depositing a layer of conductive material, notably aluminum (Al) or an alloy thereof, and etching, or by damascene techniques. Al is conventionally employed because it is relatively inexpensive, exhibits low resistivity and is relatively easy to etch. However, as the size of openings for vias/contacts and trenches is scaled down to the sub-micron range, step coverage problems result from the use of Al. Poor step coverage causes high current density and enhanced electromigration. Moreover, low dielectric constant polyamide materials, when employed as inter-metal dielectric layers, create moisture/bias reliability problems when in contact with Al, and these problems have decreased the reliability of interconnections formed between various metallization levels.

One approach to improved interconnection paths in vias involves the use of completely filled plugs of a metal, such as W. Accordingly, many current semiconductor devices utilizing VLSI (very large scale integration) technology employ Al for the metallization level and W plugs for interconnections between the different metallization levels. The use of W, however, is attendant with several disadvantages. For example, most W processes are complex and expensive. Furthermore, W has a high resistivity, which decreases circuit speed. Moreover, Joule heating may enhance electromigration of adjacent Al wiring. Still a further problem is that W plugs are susceptible to void formation, and the interface with the metallization level usually results in high contact resistance.

Another attempted solution for the Al plug interconnect problem involves depositing Al using chemical vapor deposition (CVD) or physical vapor deposition (PVD) at elevated temperatures. The use of CVD for depositing Al is expensive, and hot PVD Al deposition requires very high process temperatures incompatible with manufacturing integrated circuitry.

Copper (Cu) and Cu-based alloys are particularly attractive for use in VLSI and ULSI semiconductor devices, which require multi-level metallization levels. Cu and Cu-based alloy metallization systems have very low resistivities, which are significantly lower than W and even lower than those of previously preferred systems utilizing Al and its alloys. Additionally, Cu has a higher resistance to electromigration. Furthermore, Cu and its alloys enjoy a considerable cost advantage over a number of other conductive materials, notably silver (Ag) and gold (Au). Also, in contrast to Al and refractory-type metals (e.g., titanium (Ti), tantalum (Ta) and W), Cu and its alloys can be readily deposited at low temperatures formed by well-known "wet" plating techniques, such as electroless and electroplating techniques, at deposition rates fully compatible with the requirements of manufacturing throughput.

Electroless plating of Cu generally involves the controlled auto-catalytic deposition of a continuous film of Cu or an alloy thereof on a catalytic surface by the interaction of at least a Cu-containing salt and a chemical reducing agent contained in a suitable solution, whereas electroplating comprises employing electrons supplied to an electrode (comprising the surface(s) to be plated) from an external source (i.e., a power supply) for reducing Cu ions in solution and depositing reduced Cu metal atoms on the plating surface(s). In either case, a nucleation/seed layer is required for catalysis and/or deposition on the types of substrates contemplated herein. Finally, while electroplating requires a continuous nucleation/seed layer, very thin and discontinuous islands of a catalytic metal may be employed with electroless plating.

A number of different variations of a dual damascene process have been employed during semiconductor manufacturing. With reference to FIGS. 1A–1L, a dual damascene process for forming vias and a second metallization level over a first metallization level, according to conventional techniques, will be described. This process can be repeated to form multiple metallization levels, i.e., two or more, stacked one on top of another.

In FIG. 1A a second barrier layer 12 is deposited over a first metallization level 10. The second barrier layer 12 acts as a passivation layer that protects the first metallization level 10 from oxidation and contamination and prevents the material of the metallization level 10 from diffusing into a subsequently formed dielectric layer. The second barrier layer 12 also acts as an etch stop during subsequent etching of the dielectric layer. A typical material used as an etch stop is silicon nitride, and approximately 500 angstroms of silicon nitride is typically deposited over the metallization level 10 to form the second barrier layer 12. An illustrative process used for depositing silicon nitride is PECVD.

In FIG. 1B, a first dielectric layer 14 is deposited over the second barrier layer 12. The first dielectric layer 14 is generally formed from silicon oxide although other acceptable materials include organic polymeric materials. Many techniques are capable of providing a dielectric layer 14 formed from silicon oxide, and an illustrative process is PECVD.

In FIG. 1C, a first barrier layer 40 is deposited over the first dielectric layer 14. The first barrier layer 40 acts as an etch stop during etching of a dielectric layer subsequently formed over the first barrier layer 40. As with the second barrier layer 12, a material typically used as an etch stop is silicon nitride, and approximately 500 angstroms of silicon nitride is typically deposited over the first dielectric layer 14 to form the first barrier layer 40. An illustrative process used for depositing silicon nitride is PECVD.

In FIG. 1D, a second dielectric layer 42 is deposited over the first barrier layer 40. The second dielectric layer 42 is generally formed from silicon oxide although other acceptable materials organic polymeric materials. Many techniques are capable of forming a second dielectric layer 42 formed from silicon oxide, and an illustrative process is PECVD.

In FIG. 1E, the pattern of the vias are formed in the second dielectric layer 42 using conventional lithographic and etch techniques. The lithographic process involves depositing a resist 17 over the second dielectric layer 42 and exposing and developing the resist 17 to form the desired pattern of the vias. The first etch, which is highly selective to the material of the second dielectric layer 42, removes the second dielectric layer 42 until the etchant reaches the first barrier layer 40. The first etch is typically an anisotropic etch, such as a reactive ion plasma dry etch, that removes only the exposed portions of the second dielectric layer 42 directly below the opening in the resist 17.

In FIG. 1F, a second etch, which is highly selective to the material of the first barrier layer 40, removes the first barrier layer 40 until the etchant reaches the first dielectric layer 14. The second etch is also typically an anisotropic etch. The second etch is followed by a third etch to form the via 16. The third etch, which is highly selective to the material of the first dielectric layer 14, removes the first dielectric layer 14 until the etchant reaches the second barrier layer 12. The third etch is also typically an anisotropic etch.

In FIG. 1G, the resist 17 is removed from over the second dielectric layer 42. A typical method of removing the resist 17 is known as "ashing" whereby the resist 17 is oxidized with an $O_2$ plasma at room or elevated temperatures. After the resist 17 is removed, an anti-reflective material 48 is introduced into the via 16. The anti-reflective material 48, also known as BARC (bottom anti-reflective coating), can serve different functions such as protecting the second barrier layer 12 from attack and suppress interference waves and avoid standing waves during subsequent lithography processes.

In FIG. 1H, the trenches 46 are formed in the second dielectric layer 42 using conventional lithographic and etch techniques. The lithographic process involves depositing a resist 50 over the second dielectric layer 42 and exposing and developing the resist 50 to form the desired pattern of the trenches 46. A fourth etch, which is highly selective to the material of the second dielectric layer 42, removes the second dielectric layer 42 until the etchant reaches the first barrier layer 40. The fourth etch is typically an anisotropic etch, such as a reactive ion plasma dry etch, that removes only the exposed portions of the second dielectric layer 42 directly below the opening in the resist 50.

In FIG. 1I, the anti-reflective material 48 is removed using conventional techniques. For example, the anti-reflective material 48 can be removed with a wet-etch solution comprising $H_2SO_4/H_2O_2$ or using an anisotropic etch with $O_2$. After the anti-reflective material 48 is removed, a fifth etch, which is highly selective to the material of the first and second barrier layers 40, 12, then removes the second barrier layer 12 until the etchant reaches the first metallization level 10 and removes the first barrier layer 40 until the etchant reaches the first dielectric layer 14. The fifth etch is also typically an anisotropic etch.

In FIG. 1J, an adhesion/barrier material, such as tantalum, titanium, tungsten, tantalum nitride, or titanium nitride, is deposited. The combination of the adhesion and barrier material is collectively referred to as a third barrier layer 20. The third barrier layer 20 acts to prevent diffusion into the first and second dielectric layers 14, 42 of the conductive material subsequently deposited into the via 16 and trench 46.

In FIG. 1K, a layer 22 of a conductive material, for example, a Cu or Cu-based alloy, is deposited in the via 16 and trench 46 and over the second dielectric layer 42. A typical process initially involves depositing a "seed" layer on the barrier layer 20 subsequently followed by conventional plating techniques, e.g., electroless or electroplating techniques, to fill the via 16 and trench 46. So as to ensure complete filling of the via 16 and trench 46, the Cu-containing conductive layer 22 is deposited as a blanket (or "overburden") layer 24 so as to overfill the trench 46 and cover the upper surface 52 of the second dielectric layer 42.

In FIG. 1L, the entire excess thickness of the metal overburden layer 24 over the upper surface 52 of the second dielectric layer 42 is removed using a CMP process. A typical CMP process utilizes an alumina ($Al_2O_3$)-based slurry, which leaves a conductive plug in the via 16 and a second metallization level in the trench 46. The second metallization level has an exposed upper surface 58, which is substantially co-planar with the upper surface 52 of the second dielectric layer 42.

A problem resulting from the use of an anti-reflective material is the formation of fencing oxides. As illustrated in FIG. 2, if the anti-reflective material 48 (not shown) extends too far above the first dielectric layer 14, when the second dielectric layer 42 is etched, an oxide "fence" 54 can be formed adjacent to and around the anti-reflective material 48 that extended above the first dielectric layer 14. The fence 54 results from a slower etch rate of the second dielectric layer 42 caused by the excess anti-reflective material preventing the etching process from completely reaching the areas of the second dielectric adjacent the excess anti-reflective material and also from redeposition of the second dielectric layer 42 onto the excess anti-reflective material 48.

This fence 54 can disadvantageously produce sharp corners at the opening of the via 16. For example, when the conductive material is deposited in an opening having sharp corners, the material tends to build up more quickly at the corners than on sidewalls of the via 16. Consequentially, the material at the opposing corners can form cantilevered bridges that eventually meet in the middle of the opening. When this occurs, the opening is blocked and further deposition of material within the via 16 is prevented, thereby leaving a void in the opening. The creation of such an opening can disadvantageously cause a malfunction in the semiconductor device. Accordingly, a need exists for an improved dual damascene process that prevents the problems associated with the removal of an anti-reflective material, yet still retains the benefits associated with the use of anti-reflective material.

SUMMARY OF THE INVENTION

This and other needs are met by embodiments of the present invention which provide a method of manufacturing a semiconductor device. The method includes forming a second barrier layer over a first level, forming a first dielectric layer over the second barrier layer, forming a second dielectric layer over the first dielectric layer, etching the first and second dielectric layers to form an opening through the first dielectric layer and the second dielectric layer, depositing an organic fill material in the opening and removing a portion of the organic fill material before etching the second dielectric layer to form a trench. The organic fill material can then be completely removed and the second barrier layer is etched to expose the first level. The trench and a via are then filled with a conductive material to form a feature. The conductive material and the first level can comprise copper (Cu) or a Cu alloy.

By removing a portion of the anti-reflective material before the second dielectric layer is etched, excess amounts of organic fill material extending above the via can be reduced. Excess organic fill material can accumulate oxides during the etching of the second dielectric layer, and these oxides can hamper subsequent removal of the organic fill material. If the organic fill material cannot be completely removed, the via cannot be completely filled with the conductive material. Therefore, the partial removal of the organic fill material reduces the incidence of partly filled vias.

In another aspect of the invention, the organic fill material is an anti-reflective material. Also, the portion of the organic fill material being removed includes organic fill material positioned above the first dielectric layer. Furthermore, the portion of the organic fill material removed can be at least 500 angstroms or at least 1000 angstroms. The process of removing a portion of the organic fill material can be accomplished by oxidation, and the process of completely removing the organic fill material can be accomplished by oxidation, such as dry etching.

In a further aspect of the invention, the method can further include the steps of forming a first barrier layer between the first and second dielectric layers and etching the first barrier layer after each time the second dielectric layer has been etched. Additionally, the method can further include the steps of forming a first resist over the second dielectric layer before etching to form the opening and removing the first resist before the organic fill material is deposited. Also, the method can include the steps of forming a second resist over the second dielectric layer before etching to form the trench and removing the second resist after forming the trench.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

The present invention addresses and solves the problem of vias not being completely filled with a conductive material, such as copper, which can result in the failure of a semiconductor device. The solution is achieved by the present invention, in part, by removing a portion of organic fill material deposited within a via, prior to etching a top (or second) dielectric layer in a dual-damascene structure. Advantageously, by removing the portion of the organic fill material, excess organic fill material above the bottom (or first) dielectric layer is reduced. This excess organic fill material could otherwise cause the formation of oxides, also known as "fences," which can later cause problems in filling the via. However, by removing a sufficient amount of the organic fill material before etching the second dielectric layer, according to the invention, the formation of the oxides can be reduced or prevented.

Furthermore, the present invention addresses problems associated with the high capacitance of inter-metal dielectric layers. This is achieved, in part, by providing a dielectric layer formed from a low-k dielectric material. As used herein, the term low-k dielectric means a dielectric having a dielectric constant of less than about 3.5, e.g., less than about 2.5.

Figure 1A:
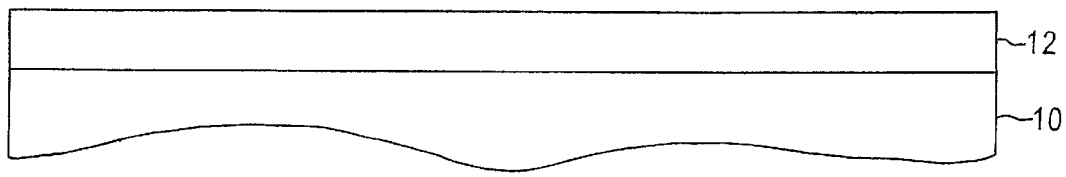
FIGS. 1A–1L schematically illustrate sequential phases of a conventional dual damascene process.
Figure 1B:
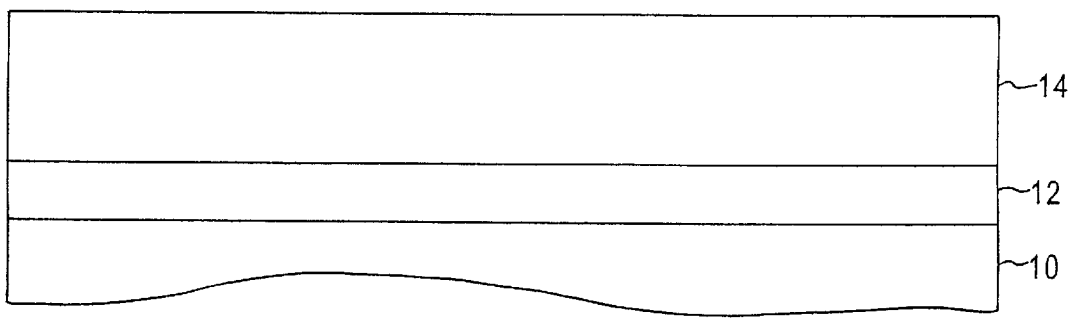
Figure 1C:
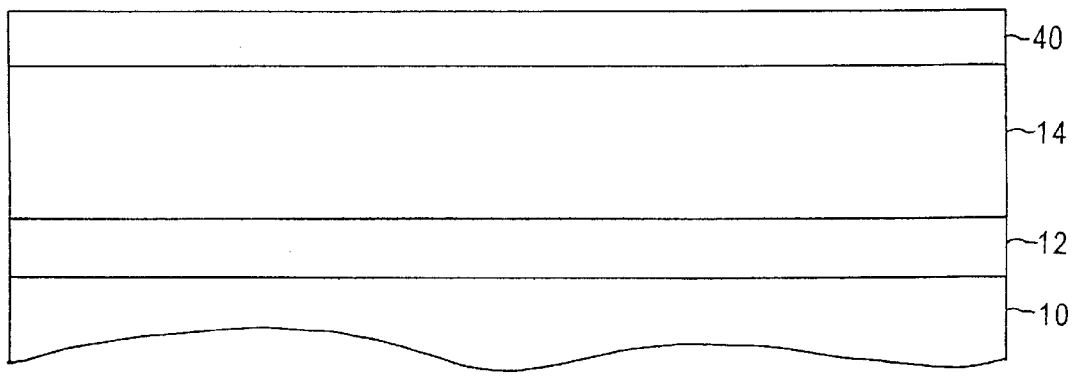
Figure 1D:
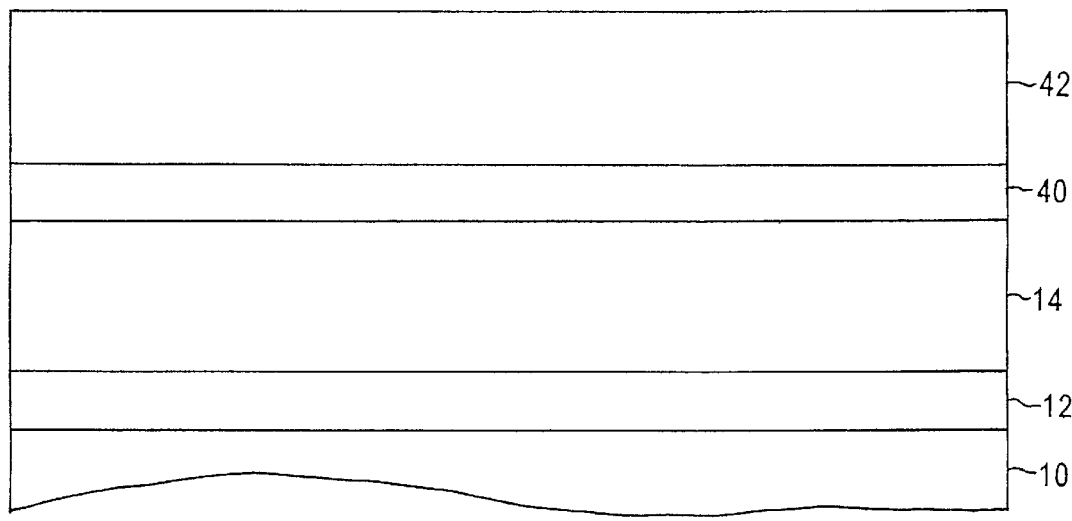
Figure 1E:
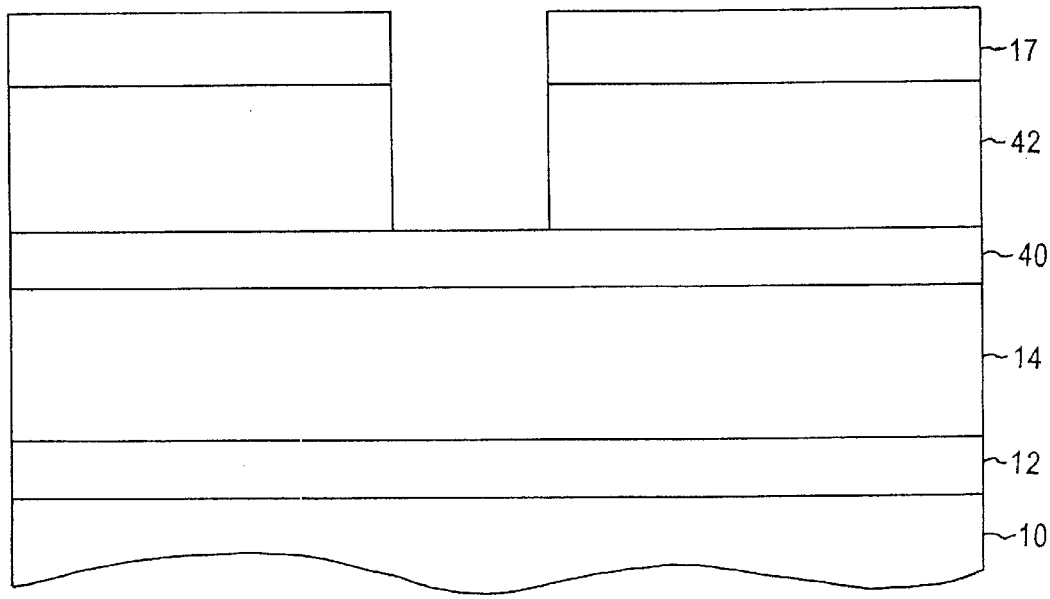
Figure 1F:
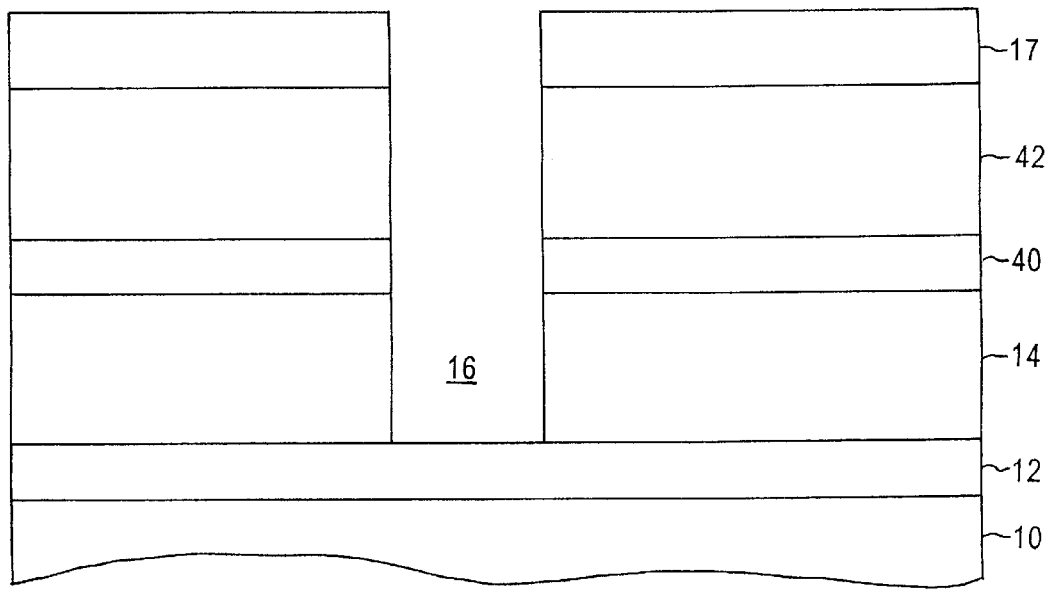
Figure 1G:
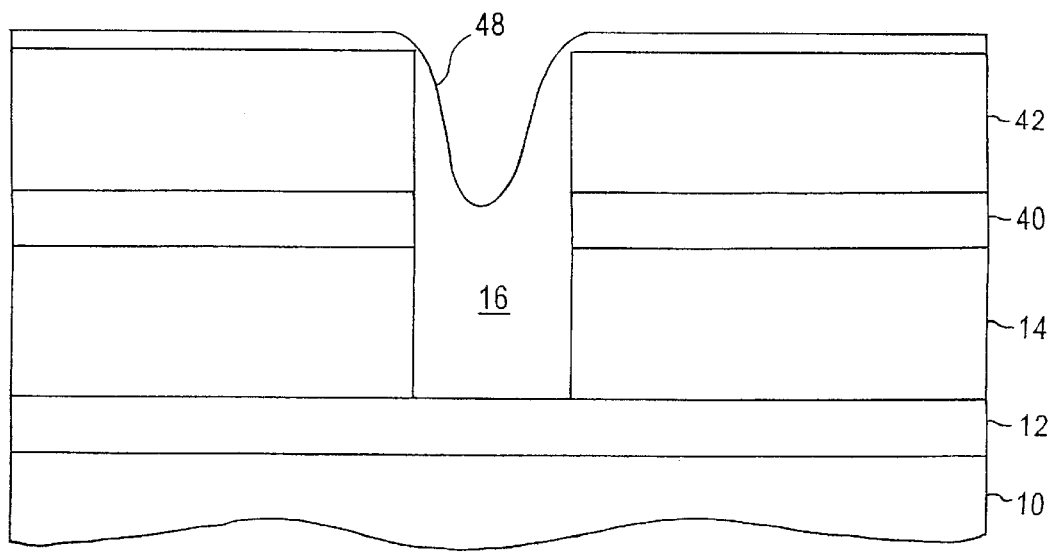
Figure 1H:
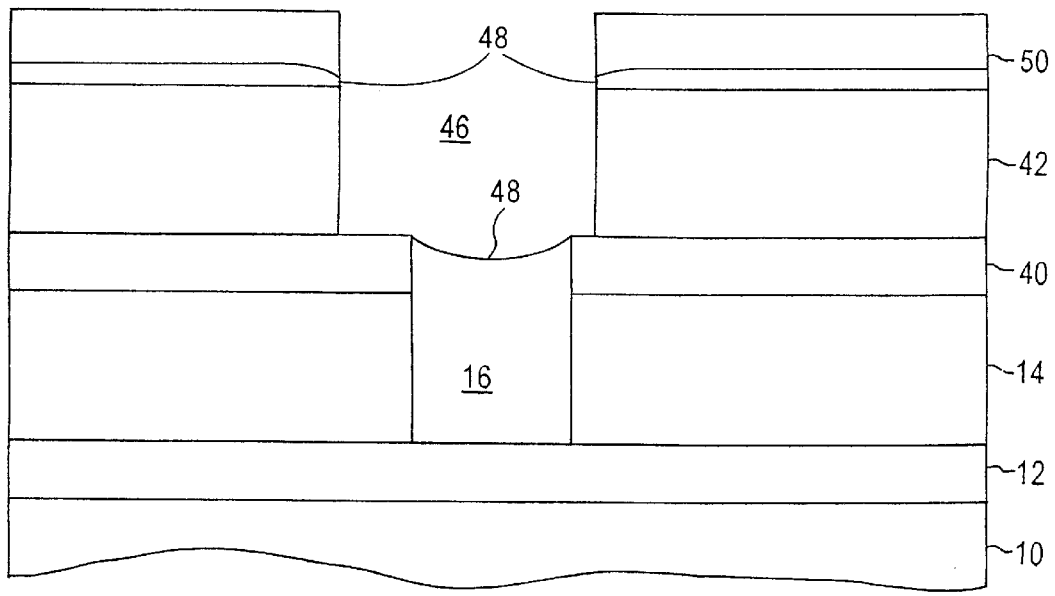
Figure 1I:
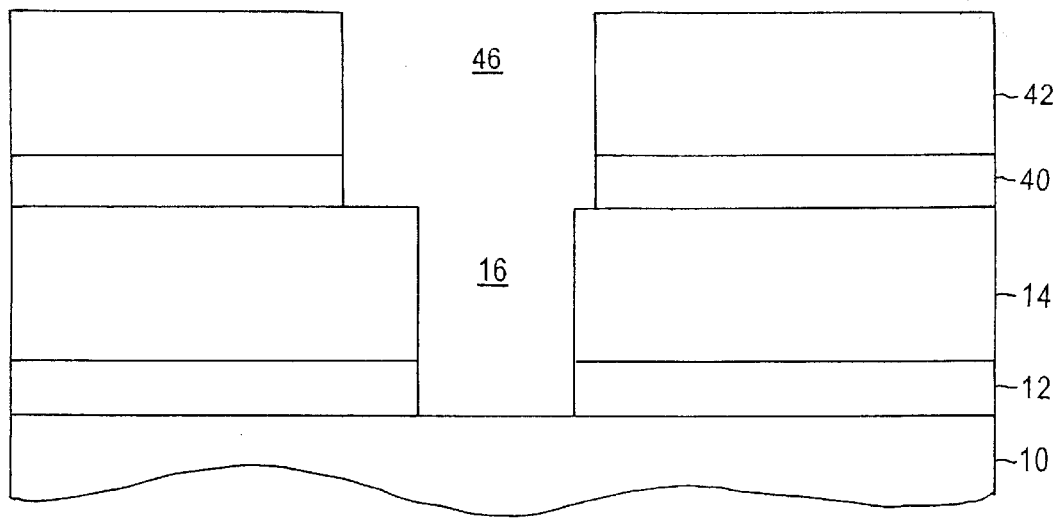
Figure 1J:
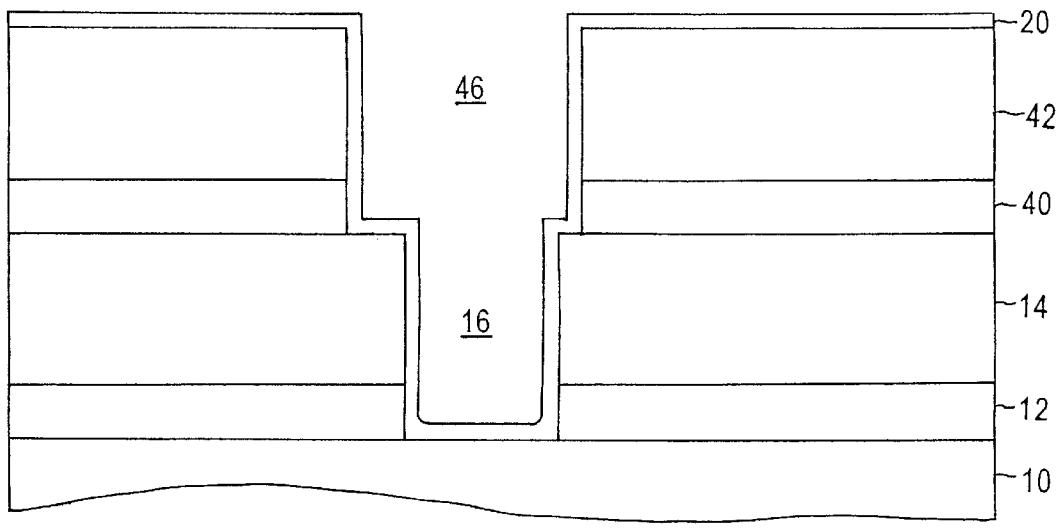
Figure 1K:
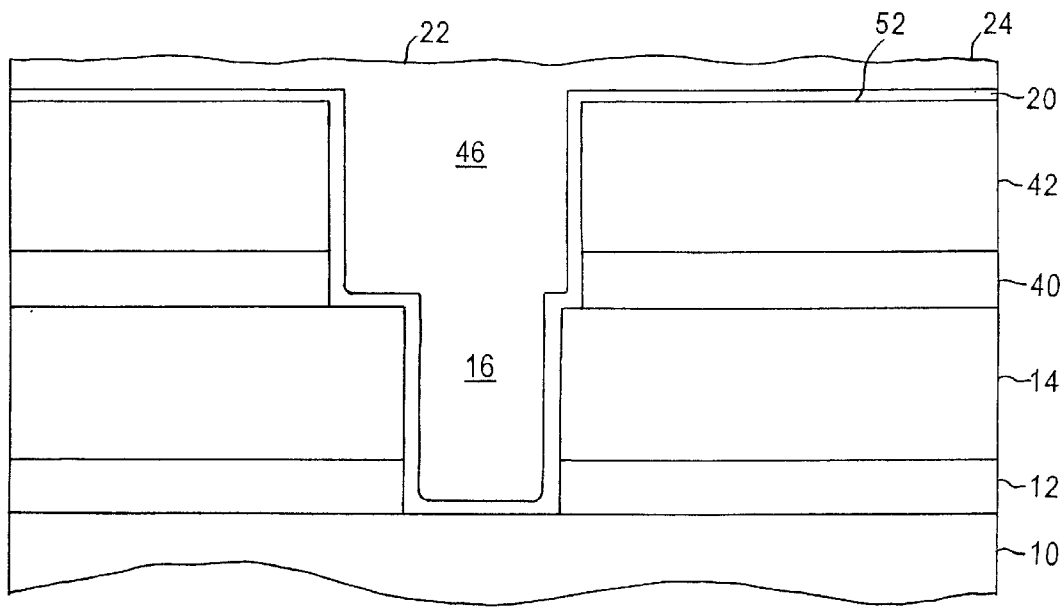
Figure 1L:
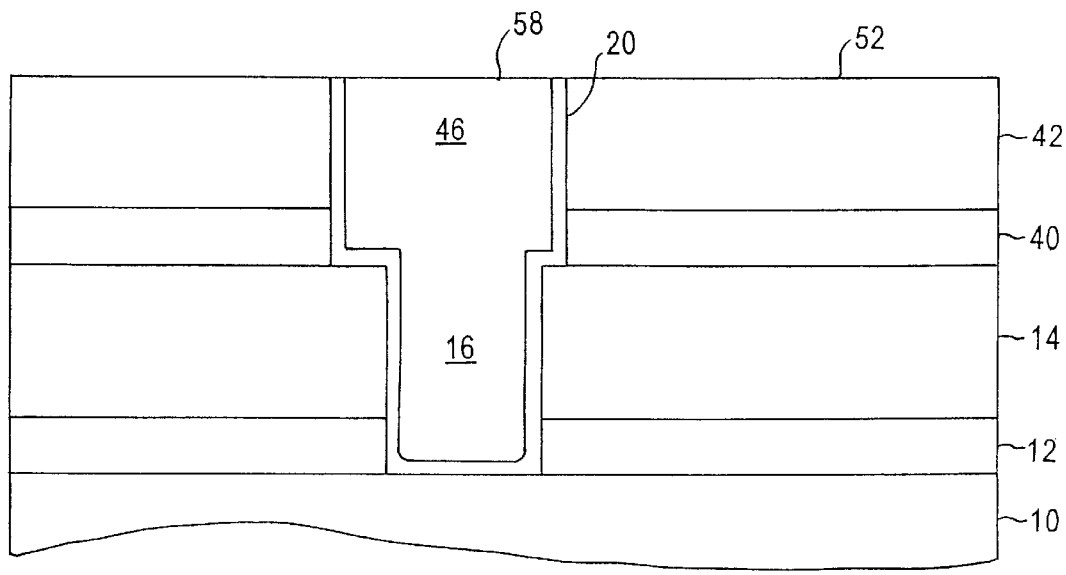
Figure 2:
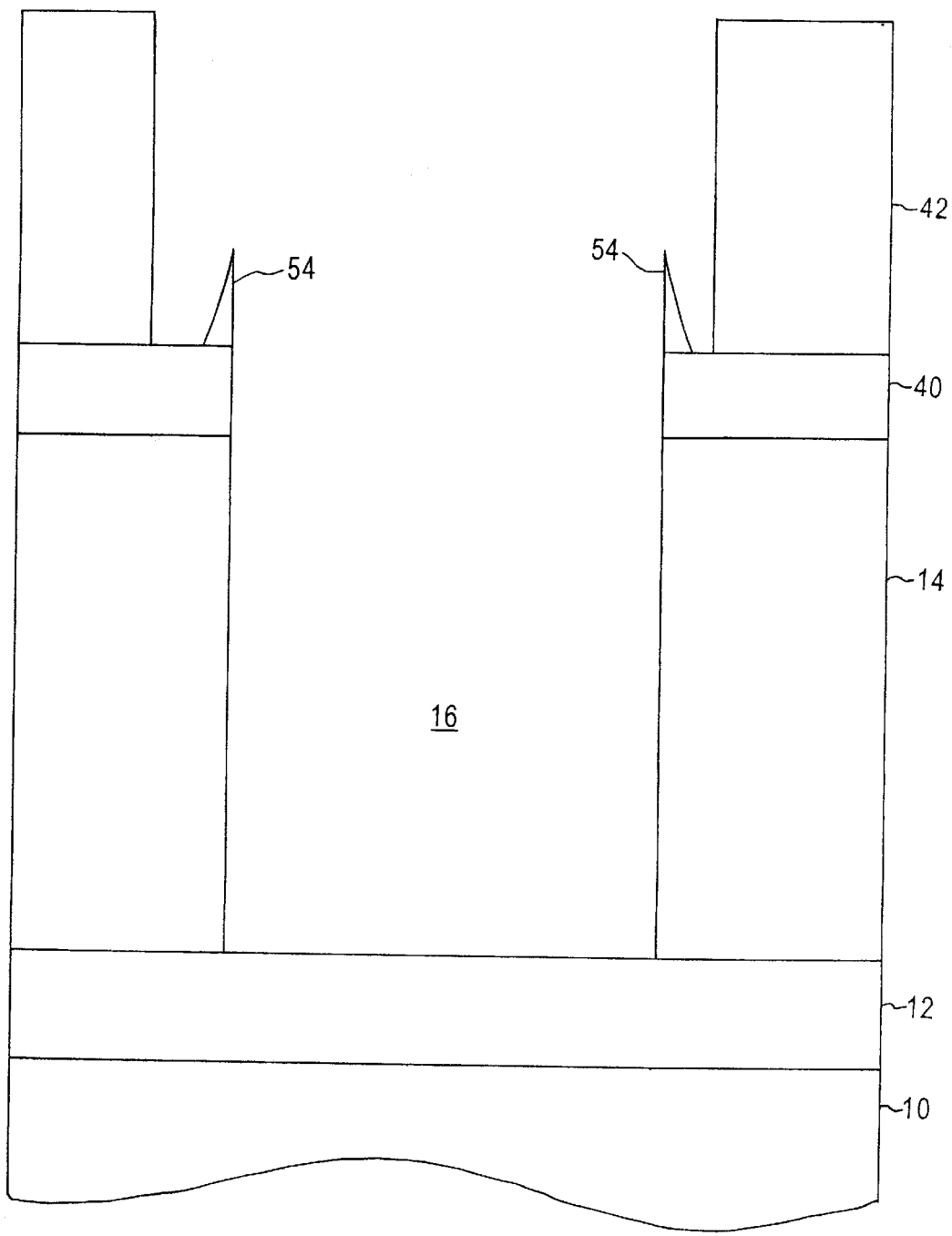
FIG. 2 illustrates a conventional via and trench after etching of the trench.
Figure 3A:
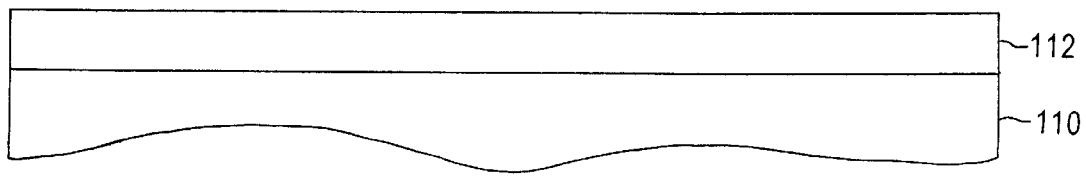
FIGS. 3A–3M schematically illustrate sequential phases of a dual damascene process according to an embodiment of the present invention.

An embodiment of the present invention is illustrated in FIGS. 3A–3M. As illustrated in FIG. 3A, a second barrier layer 112 is formed over a first level 110. The first level 110, however, is not limited as to a particular type of level. For example, the first level 110 can be a semiconductor surface, and a subsequently formed dielectric layer formed over the first level 110 can be termed an interlevel dielectric. The first level 110 can also be a metal layer substrate, such as a line or via, and the subsequently formed dielectric layer could therefore be termed an internetal dielectric. The present disclosure is applicable to either type of first level 110. In one aspect of the invention, the first level 110 is a metal layer substrate; and as such, the first level 110 is therefore hereinafter referred to as a first metallization level 110.

The second barrier layer 112 can be formed from any material that prevents diffusion of the material from the metallization level 110 into a subsequently formed dielectric layer. For example, in current aspect of the invention, the first metallization level 110 is formed from a Cu or Cu-based alloy. As such, the preferred second barrier layer 112 for use with Cu or Cu-based alloys acts as a diffusion barrier to Cu. The second barrier layer 112 can also act as a passivation layer that protects the first metallization level 110 from oxidation and contamination.

The thickness of the second barrier layer 112 depends upon several factors such as the depth of a subsequently formed via and trench in the dielectric layers over the second barrier layer 112. As such, the thickness of the second barrier layer 112 is preferably sufficient to act as an etch stop during via etch and not allow the etchant of the second barrier layer to reach the first metallization level 110. In current embodiments of the invention, the thickness of the second barrier layer 112 is at least 50 angstroms and is preferably from about 400 to about 600 angstroms.

In an aspect of the invention, the second barrier layer 112 is formed from silicon nitride although the invention is not limited in this manner. Silicon nitride advantageously acts as a diffusion barrier to copper and also as a passivation layer. Furthermore, silicon nitride acts as an etch stop to an etchant that etches silicon oxide. Any process capable of depositing the second barrier layer 112 is acceptable for use with the invention, and an illustrative process for depositing silicon nitride is PECVD.

Figure 3B:
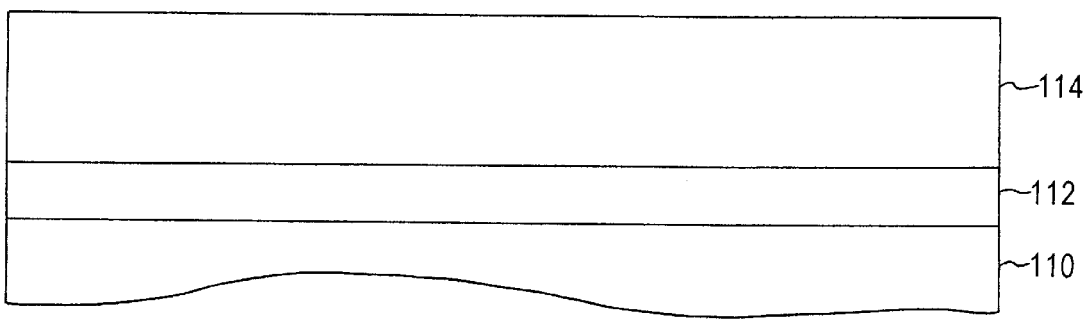

In FIG. 3B, a first dielectric layer 114 is deposited over the second barrier layer 112. The first dielectric layer 114 can be formed from any material capable of acting as a dielectric, and an illustrative material includes silicon oxide. In one aspect of the invention, the first dielectric layer 114 is formed from a low-k dielectric material. Illustrative examples of low-k dielectric materials include fluorosilicate glass (FSG or SiOF), hydrogenated diamond-like carbon (DLC), polystyrene, fluorinated polyimides, parylene (AF-4), polyarylene ether, and polytetrafluoro ethylene. In another aspect of the invention, the first dielectric layer 114 is formed from a dense or porous low-k dielectric material, such as siloxanes, silsesquioxanes, aerogels, and xerogels. These low-k dielectric materials can be applied via conventional spin-coating, dip coating, spraying, meniscus coating methods, in addition to other coating methods that are well-known in the art.

Figure 3C:
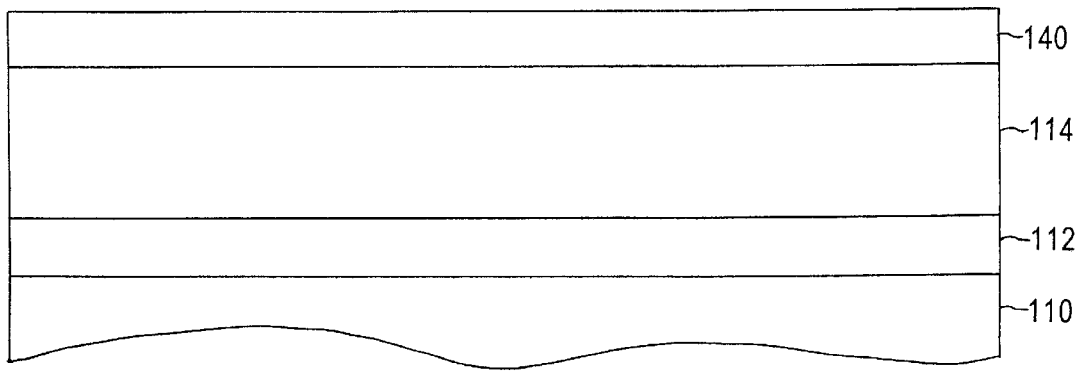

In FIG. 3C, a first barrier layer 140 is deposited over the first dielectric layer 114. The first barrier layer 140 acts as an etch stop during subsequent etching of the dielectric layer formed above the first barrier layer 140. In an aspect of the invention, the first barrier layer 140 is formed from silicon nitride although the invention in not limited in this manner.

The thickness of the first barrier layer 140 is preferably sufficient to act as an etch stop during etching of the dielectric layer formed above the first barrier layer 140. In one aspect of the invention, the thickness of the first barrier layer 140 is at least 50 angstroms and is preferably from about 400 to about 600 angstroms. Any process capable of depositing the first barrier layer 140 is acceptable for use with the invention, and an illustrative process for depositing silicon nitride is PECVD.

Figure 3D:
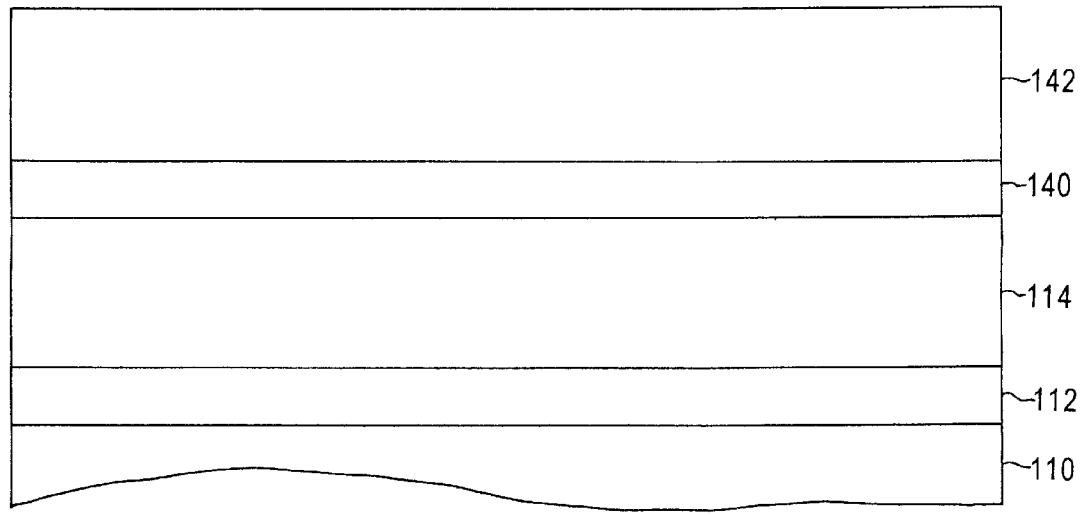

In FIG. 3D, a second dielectric layer 142 is deposited over the first barrier layer 140. The first dielectric layer 114 can be formed from any material capable of acting as a dielectric, and an illustrative material includes silicon oxide. In one aspect of the invention, the second dielectric layer 142 is formed from a low-k dielectric material. Illustrative examples of low-k dielectric materials include fluorosilicate glass (FSG or SiOF), hydrogenated diamond-like carbon (DLC), polystyrene, fluorinated polyimides, parylene (AF-4), polyarylene ether, and polytetrafluoro ethylene. In another aspect of the invention, the second dielectric layer 142 is formed from a dense or porous low-k dielectric material, such as siloxanes, silsesquioxanes, aerogels, and xerogels. These low-k dielectric materials can be applied via conventional spin-coating, dip coating, spraying, meniscus coating methods, in addition to other coating methods that are well-known in the art.

Figure 3E:
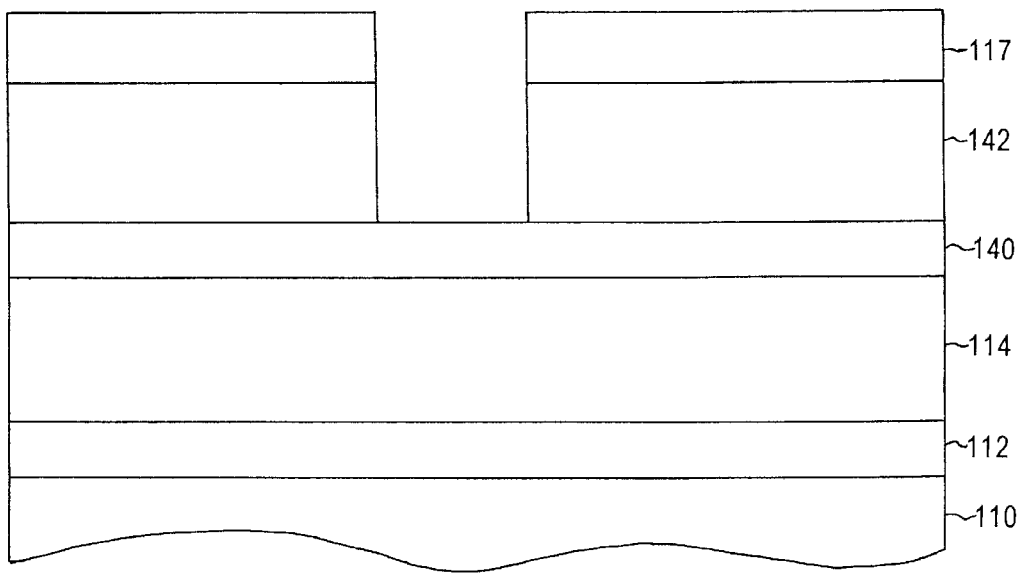

In FIG. 3E, the pattern of the vias are formed in the second dielectric layer 142 using conventional lithographic techniques, for example, optical lithography (including, for example, I-line and deep-UV), X-ray, and E-beam lithography, followed by etching. The lithographic process involves depositing a resist 117 over the second dielectric layer 142 and exposing and developing the resist 117 to form the desired pattern of the vias. The first etch, which is highly selective to the material of the second dielectric layer 142, removes the second dielectric layer 142 until the etchant reaches the first barrier layer 140. The first etch is typically an anisotropic etch, such as a reactive ion plasma dry etch, that removes only the exposed portions of the second dielectric layer 142 directly below the opening in the resist 117.

Figure 3F:
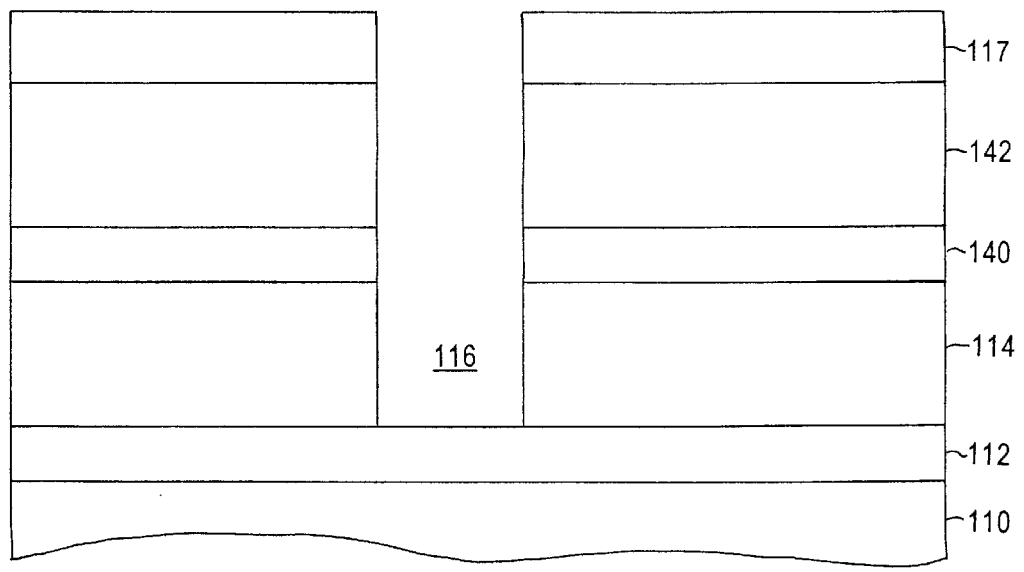

In FIG. 3F, a second etch, which is highly selective to the material of the first barrier layer 140, removes the first barrier layer 140 until the etchant reaches the first dielectric layer 114. The second etch is followed by a third etch to form the via 116. The third etch, which is highly selective to the material of the first dielectric layer 114, removes the first dielectric layer 114 until the etchant reaches the second barrier layer 112. The second and third etches are also typically anisotropic etches.

Figure 3G:
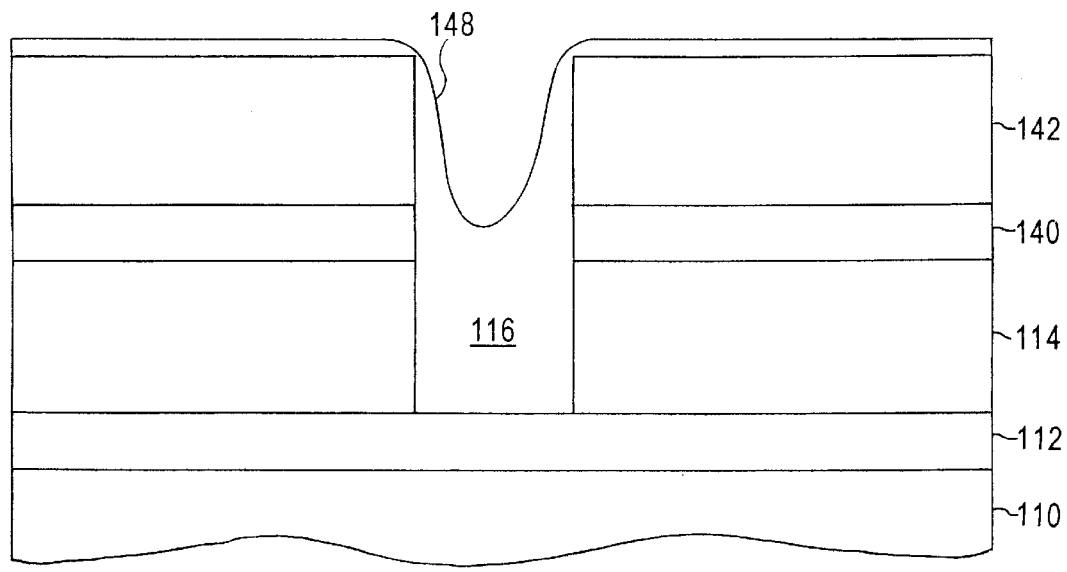

In FIG. 3G, the resist 117 is removed from over the second dielectric layer 142. A typical method of removing the resist 117 is known as "ashing" whereby the resist 117 is oxidized with an $O_2$ plasma at elevated temperatures.

The following chart provides illustrative ranges and preferred ranges for removal of the resist

| Parameter | Range | Preferred Range |
| --- | --- | --- |
| Pressure (Torr) | 0.01–5.0 | 0.2–1.0 |
| RF power (Watts) | 50–3000 | 200–1000 |
| $O_2$ flow (sccm) | 20–2000 | 100–1000 |
| Temperature (° C.) | −40–350 | 25–75 |
| Time (seconds) | 20–300 | 45–180 |

After the resist 117 is removed, an organic fill material 148 is introduced into the via 116. The organic fill material 148 can protect the second barrier layer 112 from attack during the subsequent etching of the second dielectric layer 142 to form the trench. Although the invention is not limited as to a particular organic fill material 148, in present aspects of the invention, the organic fill material 148 is an anti-reflective material. Anti-reflective materials, also known as BARC (bottom anti-reflective coating), can serve additional functions. For example, the anti-reflective material, as is known in the art, can be used to suppress interference waves and avoid standing waves during subsequent lithography processes, which advantageously allows for a higher density layout. Additionally, the anti-reflective material can be AR5 available from Shipley located in Marlborough, Mass.

Figure 3H:
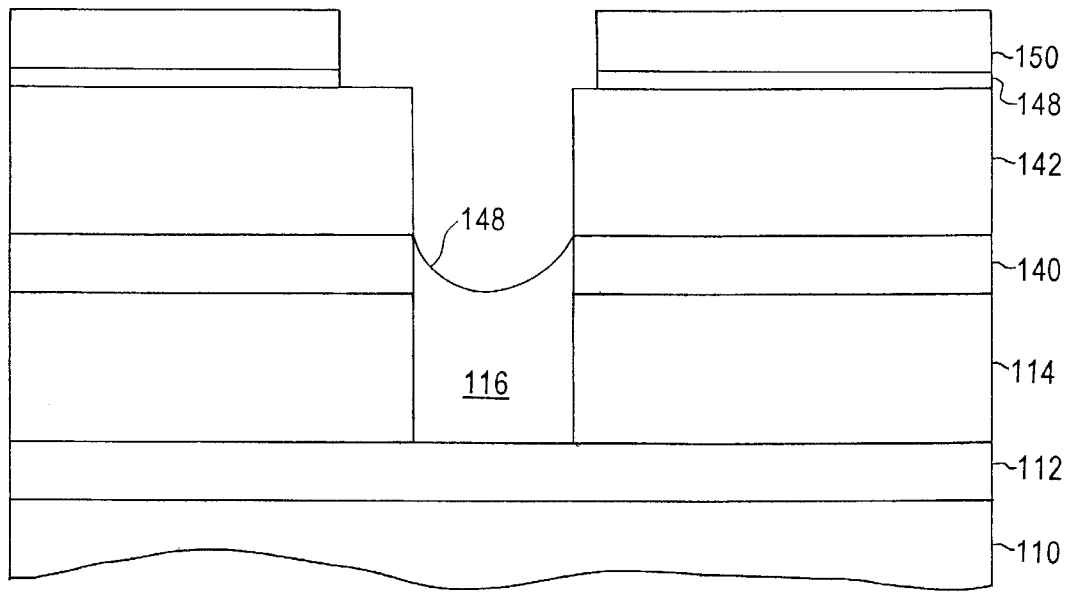

In FIG. 3H, a portion of the organic fill material 148 is removed according to an aspect of the invention. So long as the amount of organic fill material 148 being removed is sufficienit to prevent or reduce the incidence of oxide formation on the remaining organic fill material 148 during subsequent etching of the second dielectric layer 142, the invention is not limited as to a particular amount of organic fill material 148 to be removed. In a current aspect of the invention, the portion of the organic fill material 148 being removed is above the first dielectric layer 142. Additionally, at least 500 angstroms of the organic fill material 148 can be removed, as measured from the surface of the organic fill material 148, and in a preferred aspect of the invention, at least 1000 angstroms of the organic fill material 148 is removed.

The invention is not limited as to a particular method of removing the organic fill material 148. however, in a current aspect of the invention, the method of removing the organic fill material 148 does not damage the second dielectric layer 142. In one aspect of the invention, the organic fill material 148 can be removed using an oxidization process. The parameters of oxidization processes, also known as light ashing, are well known by those having ordinary skill in the art, and the invention is not limited as to particular process parameters.

Trenches 146 (best shown in FIG. 3I) are formed in the second dielectric layer 142 using conventional lithographic and etch techniques. The lithographic process involves depositing a resist 150 over the second dielectric layer 142 and exposing and developing the resist 150 to form the desired pattern of the trenches 146.

Figure 3I:
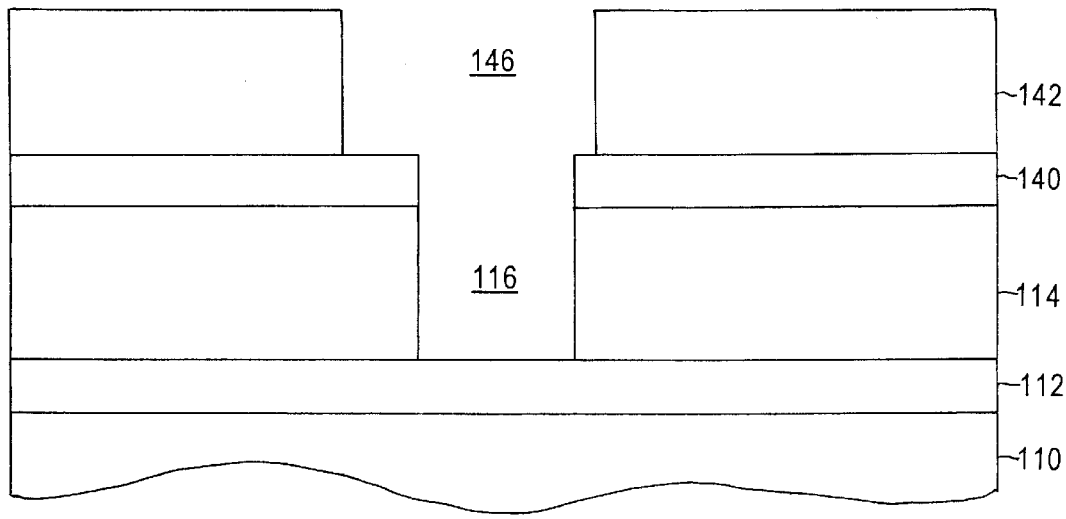

In FIG. 3I, a fourth etch, which is highly selective to the material of the second dielectric layer 142, removes the second dielectric layer 142 until the etchant reaches the first barrier layer 140. The fourth etch is typically an anisotropic etch, such as a reactive ion plasma dry etch, that removes only the exposed portions of the second dielectric layer 142 directly below the opening in the resist 150. By using an anisotropic etch, the trench 146 can be formed with substantially perpendicular sidewall is.

The organic fill material 148 is then completely removed using conventional techniques. For example, the organic fill material 148 can be removed with a wet-etch solution comprising $H_2SO_4/H_2O_2$. However, in a current aspect of the invention, both the organic fill material 148 and the second resist layer 150 are removed in situ using an ashing process. A typical ashing process has been previously discussed with regard to the removal of the first resist layer 117.

Figure 3J:
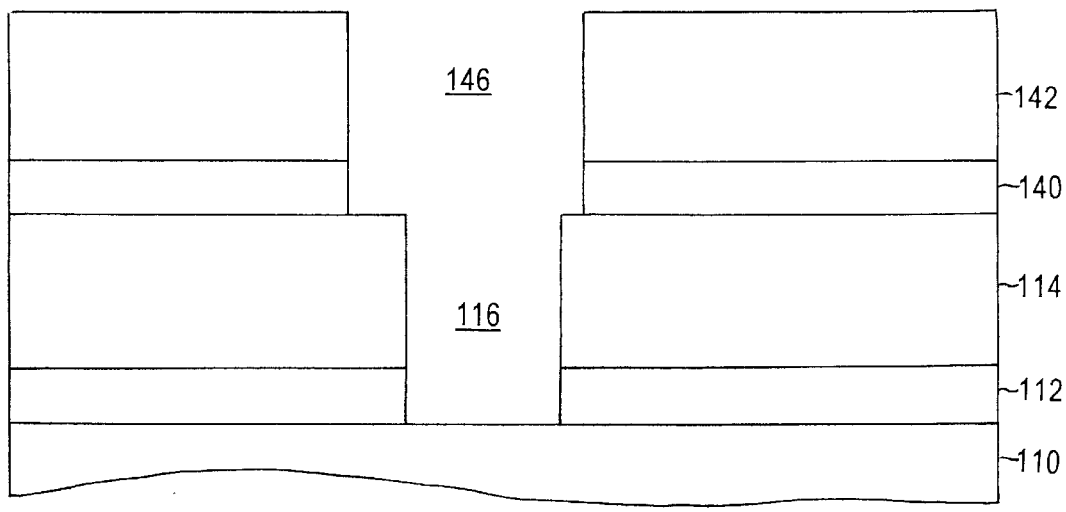

In FIG. 3J, a fifth etch, which is highly selective to the material of the first and second barrier layers 140, 112, then removes the second barrier layer 112 until the etchant reaches the first metallization level 110 and removes the first barrier layer 140 until the etchant reaches the first dielectric layer 114. An exemplary etchant for SiN is $CHF_3/N_2$. The fifth etch is also typically an anisotropic etch.

Figure 3K:
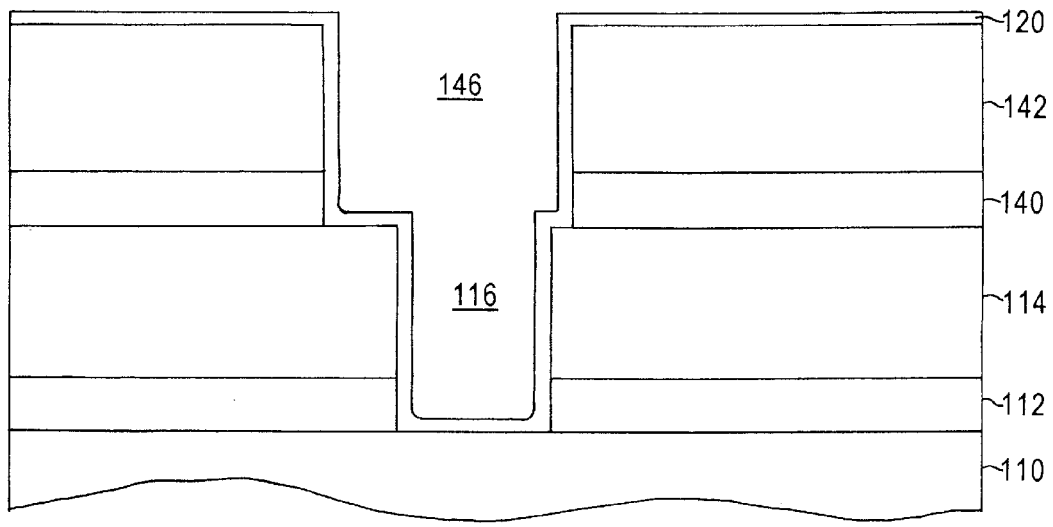

In FIG. 3K, an adhesion/barrier material, such as tantalum, titanium, tungsten, tantalum nitride, or titanium nitride, is deposited in the via 116 and trench 146. The combination of the adhesion and barrier material is collectively referred to as a third barrier layer 120. The third barrier layer 120 acts to prevent diffusion into the first and second dielectric layers 114, 142 of the conductive material subsequently deposited into the via 116 and trench 146.

Figure 3L:
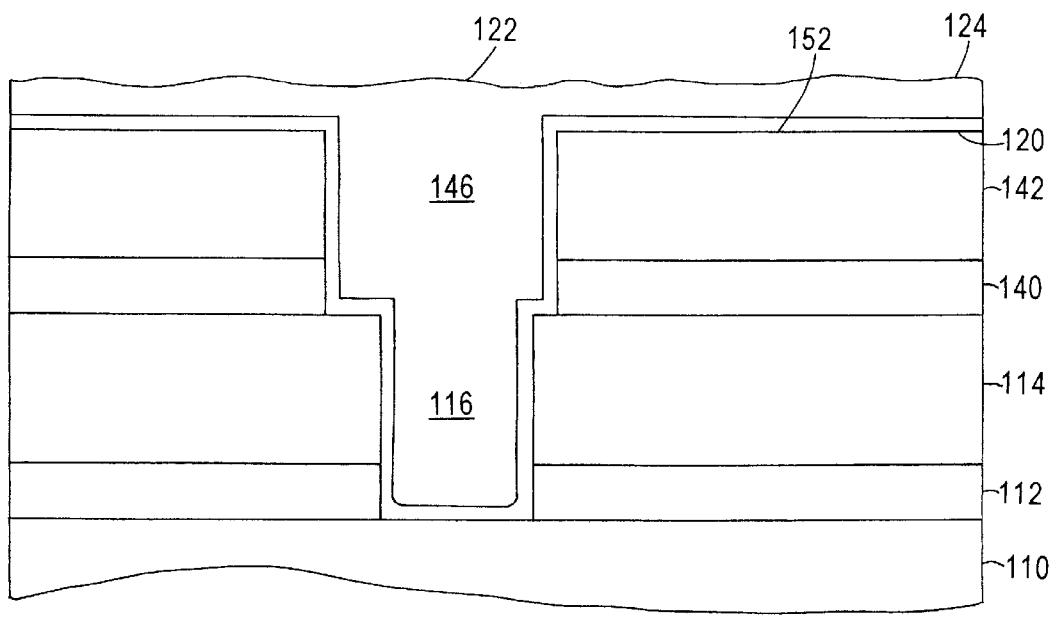

In FIG. 3L, a layer 122 of a conductive material is deposited into the via 116 and trench 146 and over the second dielectric layer 142. In current embodiments of the invention, the conductive material is a Cu or Cu-based alloy, and any process capable of depositing Cu into the via 116 and trench 146 is acceptable for use with this invention. An illustrative example of a process acceptable for use with this invention involves depositing a "seed" layer on the third barrier layer 120. After the seed layer has been formed, conventional plating techniques, e.g., electroless or electroplating techniques, are used to fill the via 116 and trench 146. So as to ensure complete filling of the via 116 and trench 146, the Cu-containing conductive layer 122 is deposited as a blanket (or "overburden") layer 124 so as to overfill the trench 146 and cover the upper surface 152 of the second dielectric layer 142.

Figure 3M:
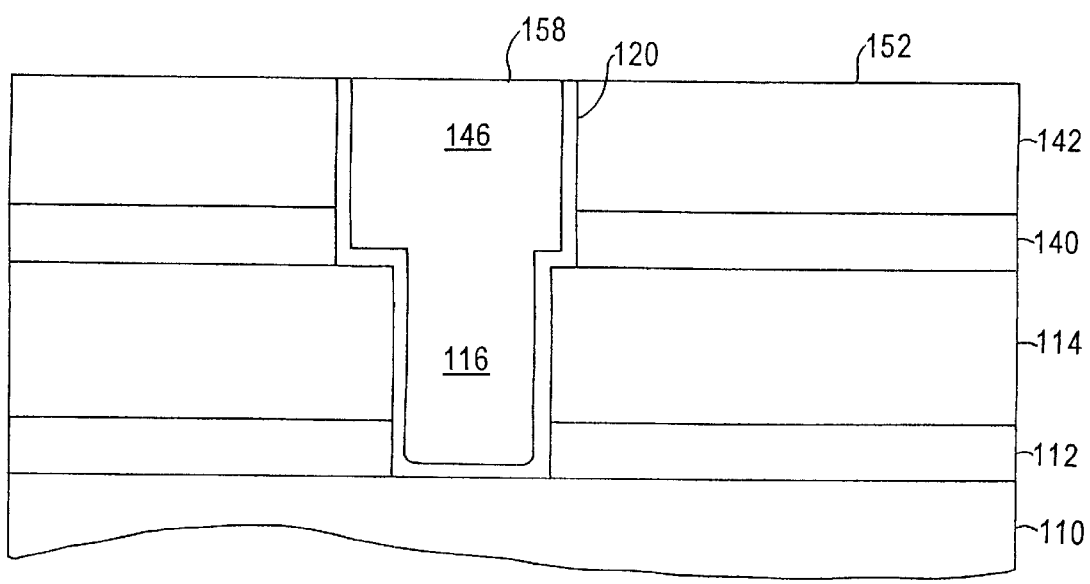

In FIG. 3M, the entire excess thickness of the metal overburden layer 124 over the upper surface 152 of the second dielectric layer 142 is removed using a CMP process. A typical CMP process utilizes an alumina ($Al_2O_3$)-based slurry, which leaves a conductive plug in the via 116 and a second metallization level in the trench 146. The second metallization level has an exposed upper surface 158, which is substantially co-planar with the upper surface 152 of the second dielectric layer 142.

By removing a portion of anti-reflective material within a via before etching of a second dielectric layer, the incidence of oxide formation on the remaining organic fill material within the via can be reduced. The oxides can accumulate on organic fill material extending beyond the via during the etching process, and these oxides can disadvantageously prevent the subsequent removal of the remaining amount of organic fill material. Any remaining amount of organic fill material can prevent subsequent filling of the via with a conductive material; and therefore, the invention advantageously reduces semiconductor defects caused by incompletely filled vias.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, comprising the steps of:

forming a second barrier layer over a first level;

forming a first dielectric layer over the second barrier layer;

forming a second dielectric layer over the first dielectric layer;

etching the first and second dielectric layers to form an opening through the first dielectric layer and the second dielectric layer, the opening including a via in the first dielectric layer;

depositing an organic fill material in the opening;

removing a portion of the organic fill material from the opening;

etching the second dielectric layer to form a trench after the portion of the organic fill material is removed;

completely removing the organic fill material;

etching the second barrier layer to expose the first level; and filling the trench and the via with conductive material to form a feature.

2. The method of manufacturing a semiconductor device according to claim 1, wherein the portion of the organic fill material removed includes organic fill material positioned above the first dielectric layer.

3. The method of manufacturing a semiconductor device according to claim 1, wherein at least 500 angstroms of the height of the organic fill material is removed during the partial removal of the organic fill material.

4. The method of manufacturing a semiconductor device according to claim 3, wherein the at least 1000 angstroms of the height of the organic fill material is removed during the partial removal of the organic fill material.

5. The method of manufacturing a semiconductor device according to claim 1, wherein the organic fill material is an anti-reflective material.

6. The method of manufacturing a semiconductor device according to claim 5, wherein said step of removing the portion of the organic fill material is by oxidization.

7. The method of manufacturing a semiconductor device according to claim 1, wherein said step of completely removing the organic fill material is by wet etching.

8. The method of manufacturing a semiconductor device according to claim 1, further comprising the steps of:

forming a first barrier layer between the first and second dielectric layers; and etching the first barrier layer after each etching of the second dielectric layer.

9. The method of manufacturing a semiconductor device according to claim 1, wherein the conductive material and the first level comprise copper (Cu) or a Cu alloy.

10. The method of manufacturing a semiconductor device according to claim 1, further comprising the steps of:

forming a first resist over the second dielectric layer before etching to form the opening; and removing the first resist before the organic fill material is deposited.

11. The method of manufacturing a semiconductor device according to claim 10, further comprising the steps of:

forming a second resist over the second dielectric layer before etching to form the trench; and removing the second resist concurrently with the completely removal of the organic fill material.

12. The method of manufacturing a semiconductor device according to claim 1, wherein the dielectric layer has a dielectric constant less than about 3.5.

13. A method of manufacturing a semiconductor device, comprising the steps of:

forming a second barrier layer over a first level;

forming a first dielectric layer over the second barrier layer;

forming a first barrier layer over the first dielectric layer forming a second dielectric layer over the first barrier layer;

forming a first resist over the second dielectric layer;

etching the first and second dielectric layers and the first barrier layer to form an opening through the first and dielectric layers and the first barrier layer, the opening including a via in the first dielectric layer;

removing the first resist;

depositing an organic fill material in the opening;

removing a portion of the organic fill material above the first dielectric layer from the opening;

depositing a second resist over the second dielectric layer, etching the second dielectric layer to form a trench after the portion of the organic fill material is removed;

removing the second resist concurrently with the complete removal of the organic fill material after the trench is formed;

etching the second barrier layer to expose the first level; and filling the trench and via with conductive material to form a feature; and planarizing a top surface of the second dielectric layer.

14. The method of manufacturing a semiconductor device according to claim 13, wherein the portion of the organic fill material removed includes organic fill material positioned above the first dielectric layer.

15. The method of manufacturing a semiconductor device according to claim 13, wherein the conductive material and the first level comprise copper (Cu) or a Cu alloy.

16. The method of manufacturing a semiconductor device according to claim 13, wherein the dielectric layer has a dielectric constant less than about 3.5.

17. The method of manufacturing a semiconductor device according to claim 13, wherein the organic fill material is an anti-reflective material.

18. The method of manufacturing a semiconductor device according to claim 17, wherein said step of removing the portion of the organic fill material is by oxidization.

19. The method of manufacturing a semiconductor device according to claim 13, wherein at least 500 angstroms of the height of the organic fill material is removed during the partial removal of the organic fill material.

20. The method of manufacturing a semiconductor device according to claim 19, wherein the at least 1000 angstroms of the height of the organic fill material is removed during the partial removal of the organic fill material.

* * * * *